United States Patent
Nakamura (10) Patent No.: US 6,381,720 B1
(45) Date of Patent: Apr. 30, 2002

(54) TEST CIRCUIT AND METHOD FOR SYSTEM LOGIC

(75) Inventor: Yoshiyuki Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/267,581

(22) Filed: Mar. 12, 1999

(30) Foreign Application Priority Data

Mar. 12, 1998 (JP) ............................................ 10-061309

(51) Int. Cl.[7] .............................................. G01R 31/28
(52) U.S. Cl. ...................................... 714/727; 714/729
(58) Field of Search ................................ 714/727, 729, 714/724, 726, 734

(56) References Cited

U.S. PATENT DOCUMENTS

| | | | |
|---|---|---|---|
| 5,173,904 A | * 12/1992 | Daniels et al. ............... | 714/729 |
| 5,448,575 A | *  9/1995 | Hashizume .................. | 714/727 |
| 5,477,548 A | * 12/1995 | Beenker et al. ............. | 714/727 |
| 5,534,774 A | *  7/1996 | Moore et al. ............ | 324/158.1 |
| 5,604,432 A | *  2/1997 | Moore et al. ............ | 324/158.1 |
| 5,627,842 A | *  5/1997 | Brown et al. ................ | 714/727 |
| 5,631,912 A | *  5/1997 | Mote, Jr. ..................... | 714/727 |
| 5,636,227 A | *  6/1997 | Segars ......................... | 714/729 |
| 6,073,254 A | *  6/2000 | Whetsel ........................ | 714/30 |

FOREIGN PATENT DOCUMENTS

JP          3-4186       1/1991

OTHER PUBLICATIONS

IEEE Standard 1149 and 1149.1a ('IEEE Standard Test Access and Boundary–Scan Architecture', IEEE Std. 1149.1–1990, 1993).*

J. Leenstra and L. Spaanenburg, "Using hierarchy in macro cell test assembly", Proceedings of the 1st European Test Conference, 1989, pp.: 63–70.*

* cited by examiner

Primary Examiner—Albert Decady
Assistant Examiner—Joseph D. Torres
(74) Attorney, Agent, or Firm—Scully, Scott, Murphy & Presser (57) ABSTRACT

There is disclosed a test circuit for testing a system logic constituted of an existing macro and a newly created circuit both mounted on a circuit board. A boundary scan circuit includes first and second boundary scan cells. A macro test circuit for testing only the existing macro independently of the newly created circuit, includes an input terminal provided on the circuit board and connected to the first boundary scan cell, a first line for connecting the input terminal to the existing macro, an output terminal provided on the circuit board and connected to the second boundary scan cell and a selector having inputs connected to the existing macro, the newly created circuit, and the second boundary scan cell, respectively, and an output connected to the output terminal. The selector is controlled by a macro test control signal Mtest and a boundary scan test control signal BStest both generated by a test access port. When the selector is controlled to select the existing macro by means of the macro test control signal Mtest, a test data is inputted from the input terminal to the existing macro, and data outputted from the existing macro is outputted through the selector to the output terminal, so that the existing macro is tested.

10 Claims, 6 Drawing Sheets

TEST CIRCUIT AND METHOD FOR SYSTEM LOGIC

BACKGROUND OF THE INVENTION

1. Field of the Invention

The present invention relates to a test circuit for a system logic, and more specifically to a test circuit for executing a test by changing over between an existing macro and a newly created circuit. Furthermore, the present invention relates to a test method performed by using the test circuit.

2. Description of Related Art

A boundary scan design based on the IEEE 1149.1 standard is one test facilitating design procedure for facilitating a test of a system circuit designed on a circuit board. In this boundary scan design, an LSI chip on a board is regarded as an internal logic in an overall system, and scannable flipflop are added to all input/output pins of the LSI as control points and observing points, in order to make it possible to write a test data to the internal LSI from an external of the board (control) and to read out an internal data from the internal LSI to an external of the board (observation).

Figure 1:
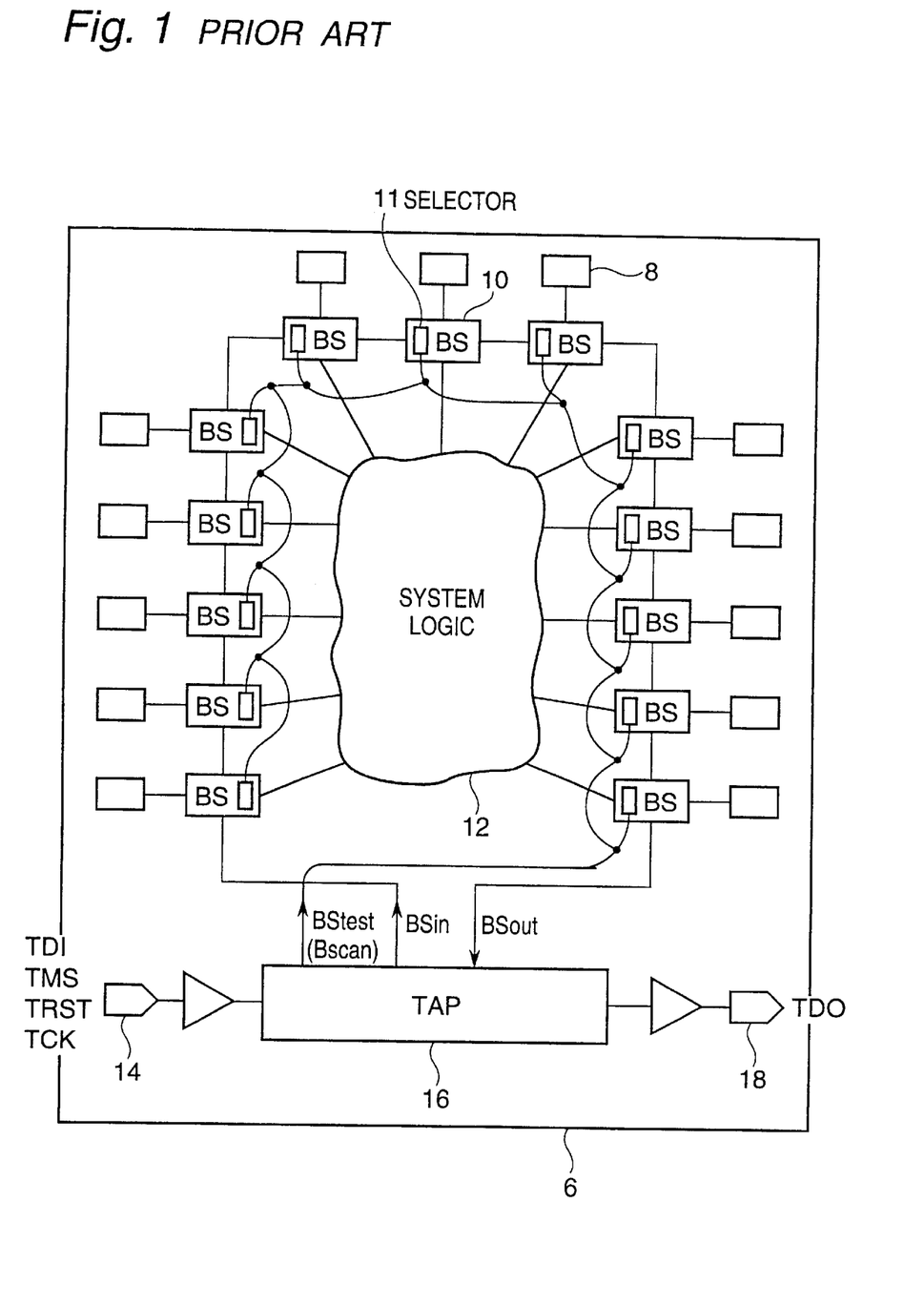
FIG. 1 is a diagram for illustrating a prior art boundary scan circuit.

Referring to FIG. 1, there is shown a diagram for illustrating a prior art boundary scan circuit. A number of boundary scan cells (BS) 10, each of which is a one-bit shift register, are located between a system logic 12 and terminals 8 of a circuit board 6. The boundary scan cells (BS) 10 are connected in series to constitute a boundary scan cell chain. A test data inputted from a TDI terminal (this terminal and other terminals are representatively designated with Reference Numeral 14) is supplied to a test access port (TAP) 16, and then further supplied from a boundary scan-in terminal BSin into the boundary scan cell chain. An output of a system logic 12 is supplied from a boundary scan-out terminal BSout to the test access port 16, and further, outputted from a data output terminal TDO 18 and compared with an expected data by an LSI tester. This boundary test is executed by supplying a boundary scan test control signal BStest generated in the test access port 16, to a selector 11 of each boundary scan cell 10.

In the system circuit designing, it is an ordinary practice that a portion of the circuit is constituted by utilizing an existing circuit or chip whose design has been already completed, without newly creating the whole of the circuit. In this specification, this existing circuit or chip will be called a "macro".

In the case that both the macro and a newly created circuit chip are mounted on a single circuit board, the prior art boundary scan circuit shown in FIG. 1 cannot carry out the test by changing over between the macro and the newly created circuit chip, since no function is provided for testing only the macro independently.

SUMMARY OF THE INVENTION

Accordingly, it is an object of the present invention to provide a test circuit for executing a test by changing over between an existing macro and a newly created circuit.

Another object of the present invention is to provide a test method for executing a test by changing over between an existing macro and a newly created circuit.

The above and other objects of the present invention are achieved in accordance with the present invention by a test circuit for testing a system logic composed of an existing macro and a newly created circuit which are mounted on a circuit board, the test circuit including a boundary scan circuit for testing the newly created circuit, and a macro test circuit for testing only the existing macro independently. The macro test circuit and the boundary scan circuit are unified so that by controlling one or two selectors, the macro test circuit and the boundary scan circuit are caused to function independently of each other.

If the test is carried out by using this test circuit, the test for the newly created circuit and the test for the existing macro can be carried out by changing over one to another. Thus, the test for the newly created circuit is carried out by using the boundary scan circuit, and the test for the existing macro is carried out by the macro test circuit.

The above and other objects, features and advantages of the present invention will be apparent from the following description of preferred embodiments of the invention with reference to the accompanying drawings.

DESCRIPTION OF THE PREFERRED EMBODIMENTS

Figure 2:
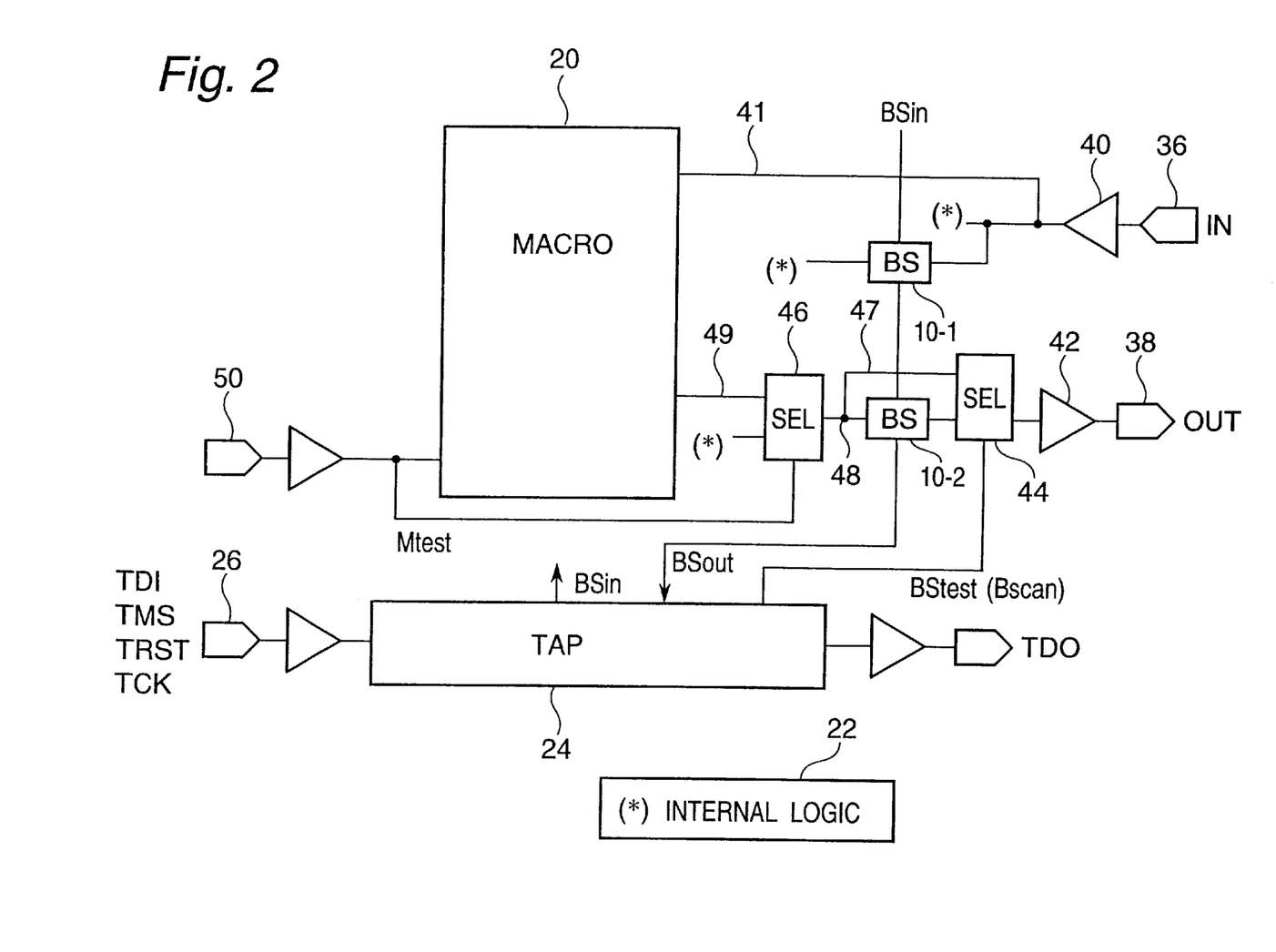
FIG. 2 is a block diagram for illustrating a first embodiment of the test circuit in accordance with the present invention.

Referring to FIG. 2, there is shown a block diagram for illustrating a first embodiment of the test circuit in accordance with the present invention.

In this first embodiment of the test circuit, a macro 20 and an LSI 22 are mounted on a circuit board (not shown in FIG. 2 but corresponding to the circuit board 6 in FIG. 1). The LSI constitutes an internal logic. In FIG. 2, only one macro and one LSI are shown for simplification of the drawing.

Figure 3:
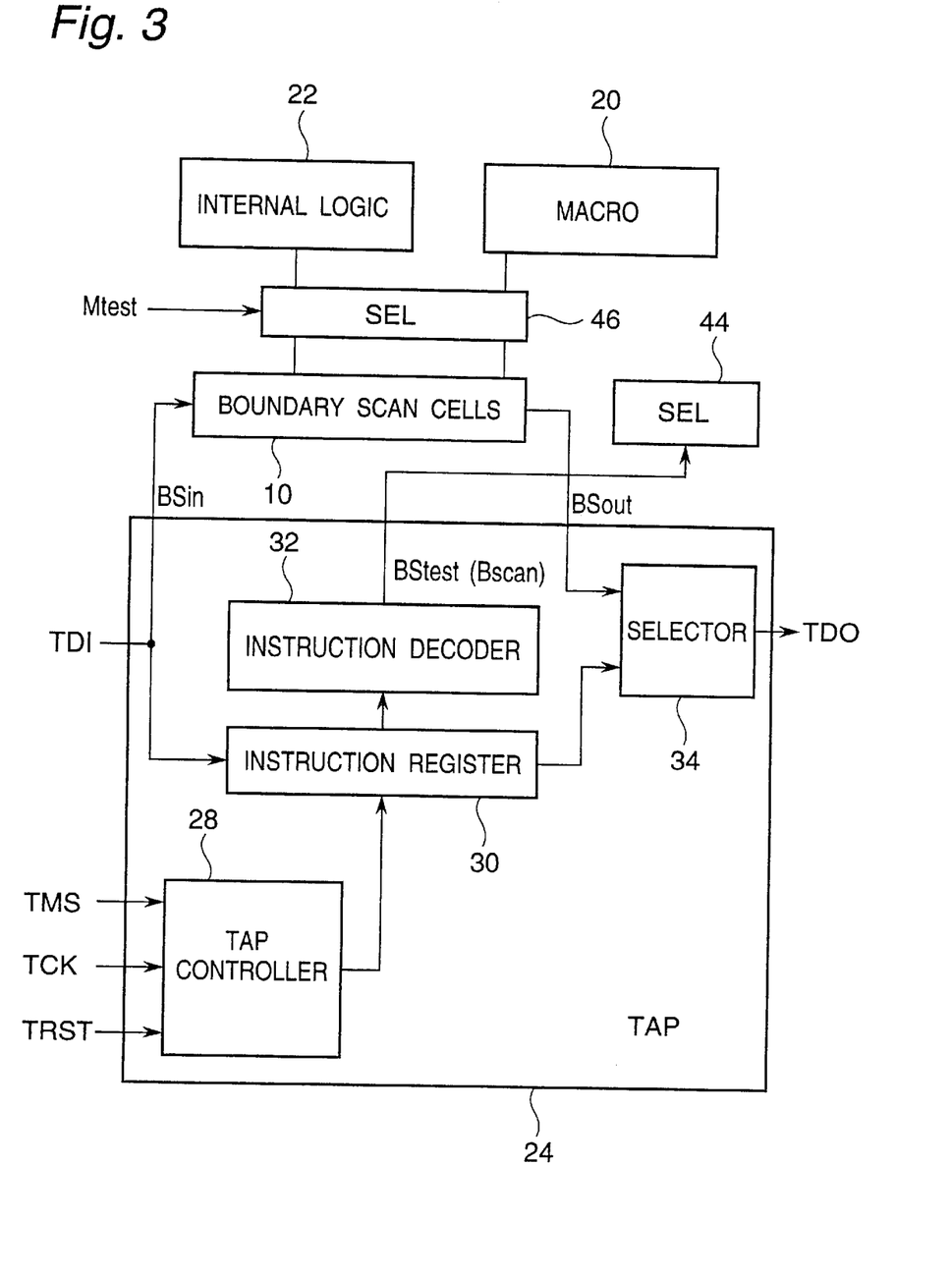
FIG. 3 is a block diagram for illustrating the test access port (TAP) incorporated in the test circuit shown in FIG. 2.

The first embodiment of the test circuit also includes a test access port (TAP) 24 provided on the circuit board. A circuit of this test access port 24 is shown in FIG. 3. As shown in FIG. 3, the test access port 24 has four input pins, namely, a test data input pin TDI 26, a test mode selection pin TMS, a power-on reset pin TRST and a test clock pin TCK. For simplification of the drawing, only one pin is shown as a representative in FIG. 2.

The test access port 24 includes a TAP controller 28 receiving a TMS signal, a TCK signal and a TRST signal, an instruction register 30 receiving a TDI signal and controlled by the TAP controller 28, an instruction decoder 32 connected to the instruction register 30, and a selector 34 coupled to receive an output of the instruction register 30 and a boundary scan-out terminal BSout of a boundary scan cell chain 10. The TDI signal is also connected to a boundary scan-in terminal BSin of the boundary scan cell chain 10.

An input end and an output end of the boundary scan cell chain 10, constituted of a number of series-connected boundary scan cells, constitute the boundary scan-in terminal BSin and the boundary scan-out terminal BSout, respectively. For simplification of the drawing, in FIG. 2, there are shown only two boundary scan cells 10-1 and 10-2 provided for the internal logic 22 and the macro 20. The boundary scan cell 10-1 is connected between the internal logic 22 and an input pin 36, and the boundary scan cell 10-2 is connected between the internal logic 22 and an output pin 38.

An input buffer 40 having an input connected to the input pin 36, has an output connected to the boundary scan cell 10-1 and also connected through a line 41 to one input of the macro 20. An output buffer 42 having an output connected to the output pin 38, has an input connected to an output of a selector 44 having a pair of inputs, one of which is connected to the boundary scan cell 10-2. A selector 46 having a pair of inputs, has an output connected to the boundary scan cell 10-2. The other input of the selector 44 is connected through a line 47 to a connection node 48 between the boundary scan cell 10-2 and the output of the selector 46. One input of the selector 46 is connected to one output of the internal logic 22, and the other input of the selector 46 is connected through a line 49 to one output of the macro 20.

In the test access port 24 shown in FIG. 3, the TAP controller 28 functions in accordance with an input sequence of the test mode selection signal TMS as a simple status transition control circuit which controls various operations of the overall boundary scan circuit. In this operation, under control of the test mode selection signal TMS, a given instruction is fetched in the instruction register 30 through the test data input pin TDI, and then, is decoded by the instruction decoder 32, so that the status is changed. In this embodiment, the instruction decoder 32 generates a boundary scan test control signal BStest (or Bscan) for switching over the selector 44.

The TAP controller 28, the instruction register 30, the instruction decoder 32, the selector 34, and the signals TDI, TDO, TMS, TCK, TRST Bscan, as mentioned above, are defined in the IEEE 1149.1 standard. Therefore, further description will be omitted.

Returning to FIG. 2, the shown embodiment of the test circuit includes a macro test control terminal 50 provided on the circuit board for receiving a macro test control signal Mtest. This macro test control signal Mtest is supplied to the macro 20 and the selector 46.

Figure 4:
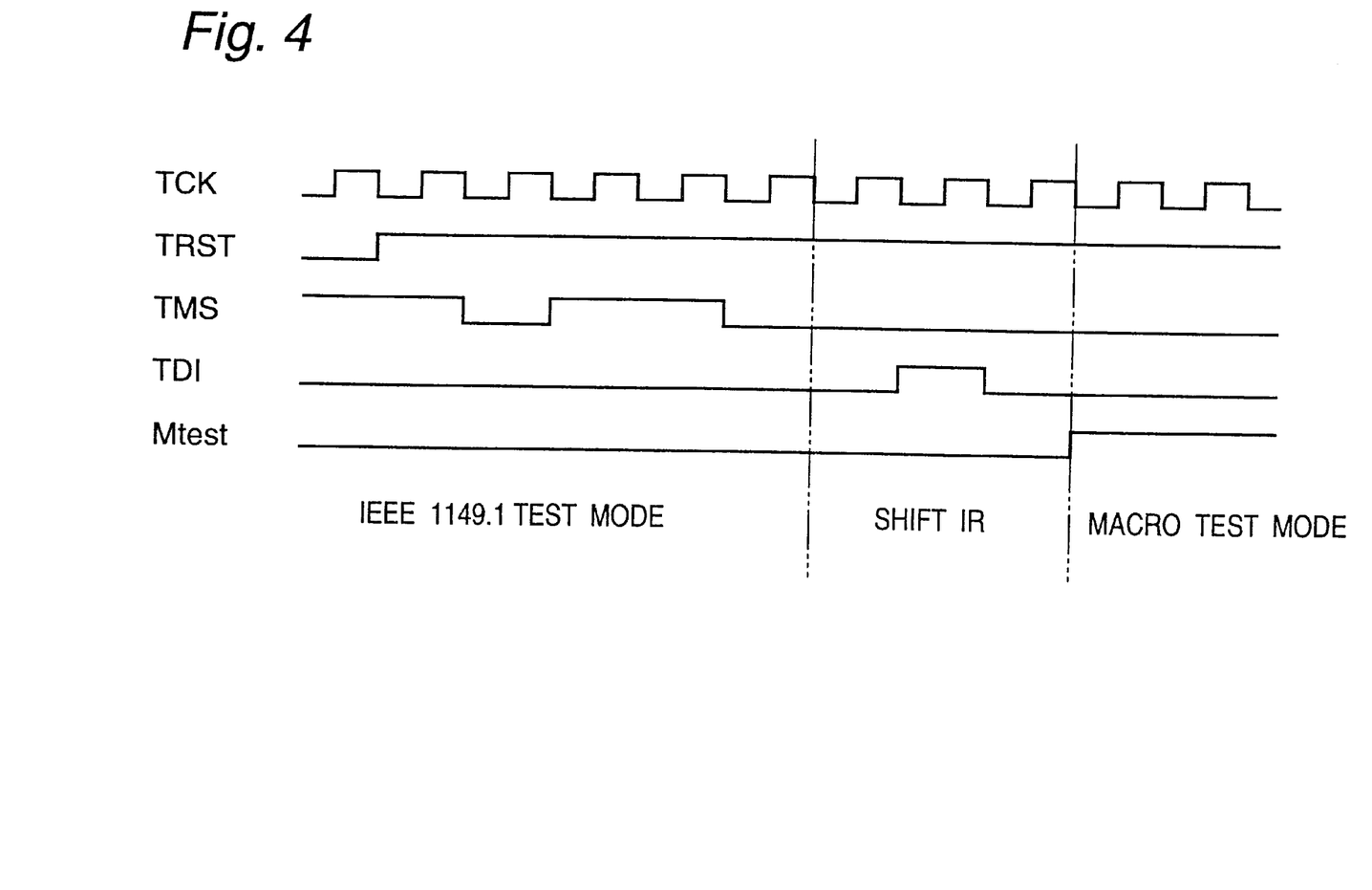
FIG. 4 is a timing chart for illustrating an operation of the test circuit in accordance with the present invention.

Now, an operation of the above mentioned boundary scan circuit, carried out by changing the test from the existing macro 20 to the internal logic 22 (which is a newly created circuit) both mounted on the circuit board, or vice versa, will be described with reference to FIG. 4 which is a timing chart for illustrating an operation of the test circuit.

In the case of testing the internal logic 22, the TAP controller 28 of the test access port 24 is brought into a boundary scan test mode in response to the test mode selection signal TMS. An instruction is fetched into the instruction register 30 under control of the TAP controller 28, and then, the instruction is decoded by the instruction decoder 32, so that the instruction decoder 32 activates the boundary scan control signal BStest to "1". In response to the boundary scan control signal BStest of "1", the selector 44 selects the boundary scan cell 10-2. On the other hand, the macro test control signal Mtest is deactivated to "0", and in response to the macro test control signal Mtest of "0", the selector 46 selects the internal logic 22.

In the above mentioned condition of the selectors 44 and 46, a test data is inputted through the test data input terminal TDI, and the output from the internal logic 22 is selected by the selector 34, and then, is outputted from the test data output terminal TDO to an external.

Thus, the internal logic 22, which is a newly created circuit, is tested in the boundary scan test mode defined in the IEEE 1149.1standard. Since the boundary scan test mode defined in the IEEE 1149.1 standard is well known, a further explanation of the boundary scan test will be omitted.

In order to move from the boundary scan test mode to the macro test mode, after the condition gas moved into a "SHIFT IR" mode in accordance with the procedures defined in the IEEE 1149.1 standard, the macro test control signal Mtest is activated to "1". With the macro test control signal Mtest of "1", the macro 20 recognizes that the macro 20 itself is put in a test mode. Furthermore, in response to the macro test control signal Mtest of "1", the selector 46 selects the macro 20. In addition, another instruction is fetched into the instruction register 30 and then is decoded by the instruction decoder 32, so that the instruction decoder 32 deactivates the boundary scan control signal BStest to "0". In response to the boundary scan control signal BStest of "0", the selector 44 selects the line 47.

In the macro test mode settled as mentioned above, the input terminal 36 is connected through the input buffer 40 and the line 41 to the macro 20, and the output terminal 38 is connected through the output buffer 42, the selector 44, the line 47, the selector 46 and the line 49 to the macro 20. Accordingly, a test data is supplied through the input terminal 36 to the macro 20, and the data outputted from the macro 20 is outputted from the output terminal 38 to an external. Thus, the test of only the macro can be carried out independently of the internal logic 22, under the predetermined procedures of the boundary scan test.

Figure 5:
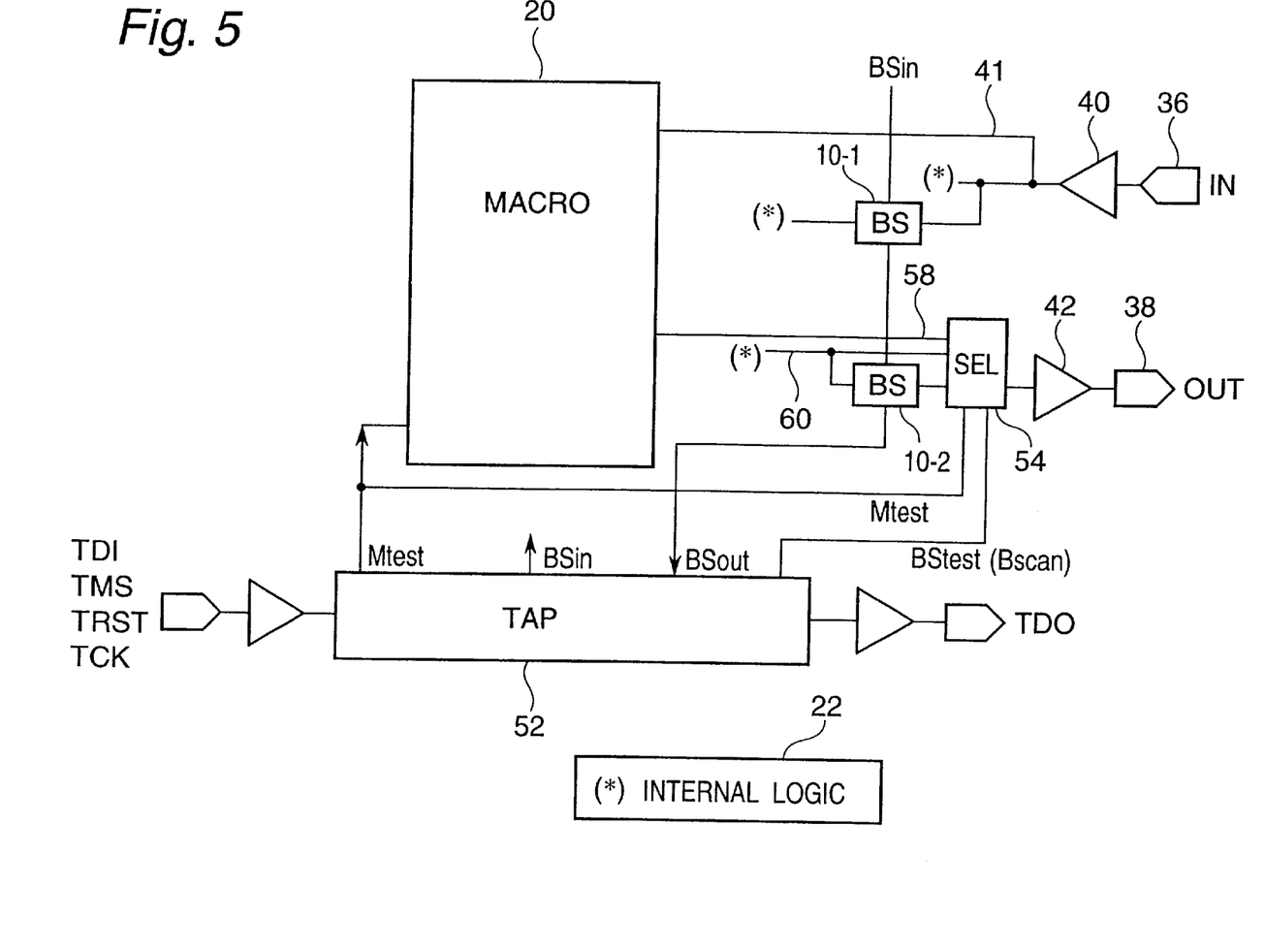
FIG. 5 is a block diagram for illustrating a second embodiment of the test circuit in accordance with the present invention.
Figure 6:
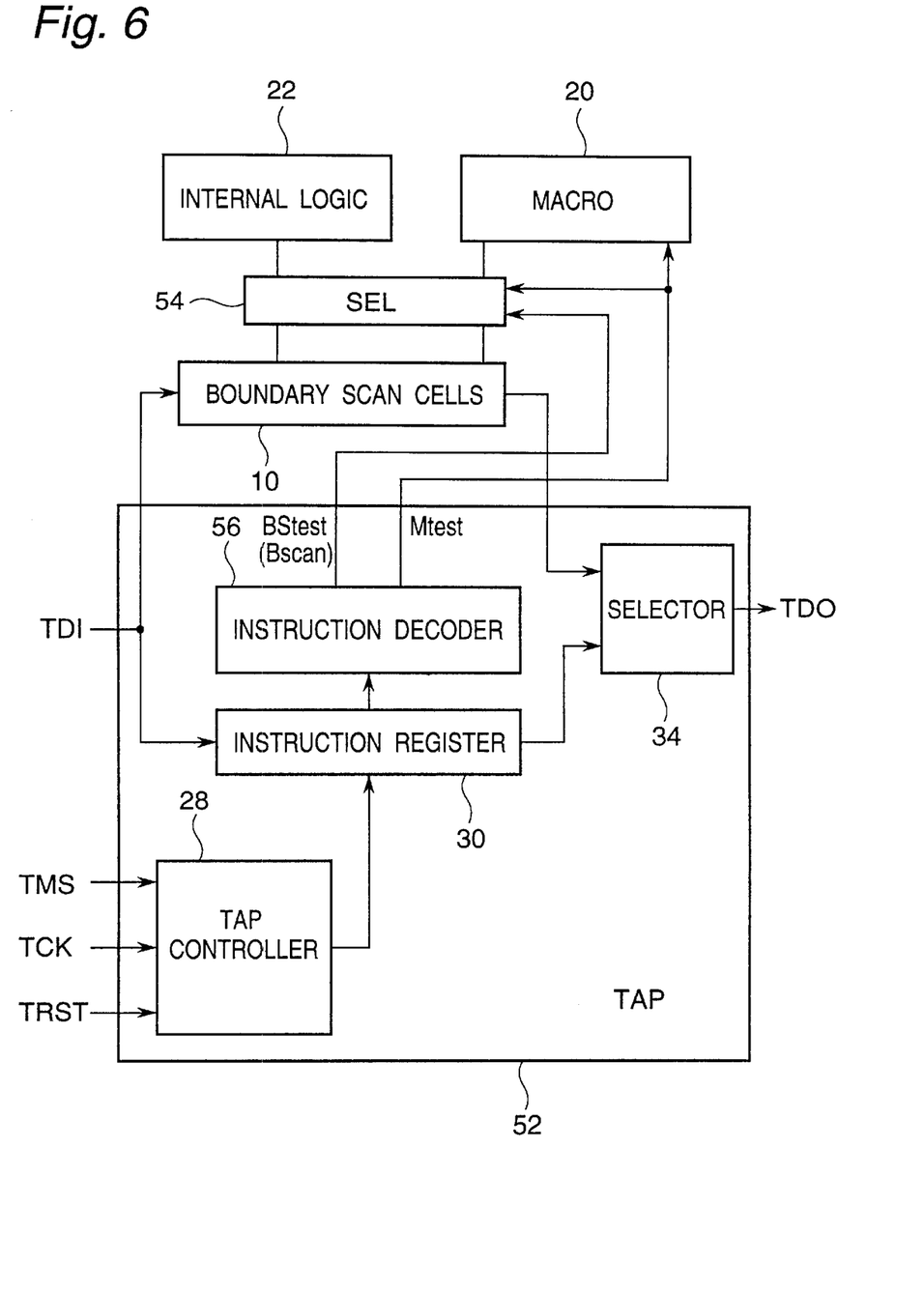
FIG. 6 is a block diagram for illustrating the test access port (TAP) incorporated in the test circuit shown in FIG. 5.

Now, a second embodiment of the test circuit in accordance with the present invention will be described with reference to FIGS. 5 and 6. FIG. 5 is a block diagram for illustrating the second embodiment of the test circuit in accordance with the present invention, and FIG. 6 is a block diagram for illustrating the test access port (TAP) incorporated in the test circuit shown in FIG. 5. In FIGS. 5 and 6, elements similar to those shown in FIGS. 2 and 3 are given the same Reference Numerals and Signs, and explanation will be omitted.

The second embodiment of the test circuit is featured in that the external macro test control terminal (Mtest) provided in the first embodiment is omitted, and one of the two selectors located between the macro and the output terminal in the first embodiment for switching over between the macro test and the boundary scan test is omitted for improving a delay overhead caused by these two selectors.

As shown in FIG. 5, the second embodiment includes no external macro test control terminal (Mtest), but a test access port (TAP) 52 is so configured to generate the macro test control signal Mtest. In addition, one selector 54 is provided between the macro 20 and the output terminal 38, in place of the two selectors in the first embodiment.

An output of the selector 54 is connected to the input of the output buffer 42. A first input of the selector 54 is connected through a line 58 to the output of the macro 20, and a second input of the selector 54 is connected through a line 60 to the output of the internal logic 22. A third input of the selector 54 is connected through the boundary scan cell 10-2 to the internal logic 22. The selector 54 is controlled by the boundary scan test control signal BStest and the macro test control signal Mtest.

As seen from comparison between FIGS. 3 and 6, the test access port (TAP) 52 includes an instruction decoder 56 which generates not only the boundary scan test control signal BStest but also the macro test control signal Mtest, differently from the instruction decoder 32 of the first embodiment. Incidentally, the macro test control signal Mtest is not defined in the IEEE 1149.1 standard, but is generated in the instruction decoder 56 in accordance with the rule of the "USER CODE INSTRUCTION" defined in the IEEE 1149.1 standard (the rule for an arbitrary test mode).

Now, an operation of the above mentioned boundary scan circuit, carried out by changing the test from the existing macro 20 to the internal logic 22 (which is a newly created circuit) both mounted on the circuit board, or vice versa, will be described with reference to FIG. 4.

In the case of testing the internal logic 22, the TAP controller 28 of the test access port 52 is brought into a boundary scan test mode in response to the test mode selection signal TMS. An instruction is fetched into the instruction register 30 under control of the TAP controller 28, and then, the instruction is decoded by the instruction decoder 56, so that the instruction decoder 56 activates the boundary scan control signal BStest to "1".

In the above mentioned condition of the selector 54, a test data is inputted through the test data input terminal TDI, and the output from the internal logic 22 is selected by the selector 34, and then, is outputted from the test data output terminal TDO to an external.

Thus, the internal logic 22, which is a newly created circuit, is tested in the boundary scan test mode defined in the IEEE 1149.1 standard.

In order to move from the boundary scan test mode to the macro test mode, the condition moves in a "SHIFT IR" mode in accordance with the procedures defined in the IEEE 1149.1 standard, and then, an instruction code "010" previously determined for the macro test mode (in accordance with the rule of the "USER CODE INSTRUCTION" defined in the IEEE 1149.1 standard) is inputted through to the test data input terminal TDI into the instruction register 30.

Thus, the instruction decoder 56 decodes the given instruction code, and activates the macro test control signal Mtest to "1". The macro test control signal Mtest is supplied to the macro 20 and the selector 54. With the macro test control signal Mtest of "1", the macro 20 recognizes that the macro 20 itself is put in a test mode. On the other hand, the selector 54 selects the macro 20.

In the macro test mode settled as mentioned above, the input terminal 36 is connected through the input buffer 40 and the line 41 to the macro 20, and the output terminal 38 is connected through the output buffer 42, the selector 54 and the line 58 to the macro 20. Accordingly, a test data is supplied through the input terminal 36 to the macro 20, and the data outputted from the macro 20 is outputted from the output terminal 38 to an external. Thus, the test of only the macro can be carried out independently of the internal logic 22, under the predetermined procedures of the boundary scan test.

In the above mentioned boundary scan test circuit of the second embodiment, since the test access port 52 generates the macro test control signal Mtest, the external macro test control terminal provided in the first embodiment is no longer necessary. In addition, since the delay caused by the test circuit between the macro and the output terminal is only the delay caused by only one selector, the delay overhead becomes smaller than that in the first embodiment.

As seen from the above, according to the present invention, when the macro is mounted on a circuit board together with a circuit chip which is a newly created circuit, the test can be carried out by changing between the macro and the newly created circuit.

The invention has thus been shown and described with reference to the specific embodiments. However, it should be noted that the present invention is in no way limited to the details of the illustrated structures but changes and modifications may be made within the scope of the appended claims.

I claim:

1. A test circuit for testing a system logic constituted of an existing macro and a newly created circuit both mounted on a circuit board, comprising a boundary scan circuit for testing said newly created circuit and a macro test circuit for testing only said existing macro independently of said newly created circuit, said boundary scan circuit including at least a first boundary scan cell and a second boundary scan cell, and said macro test circuit including an input terminal provided on said circuit board and connected to said first boundary scan cell, a first line for connecting said input terminal to said existing macro, an output terminal provided on said circuit board and connected to said second boundary scan cell, a first selector having inputs connected to said existing macro and said newly created circuit, respectively, and an output connected to said second boundary scan cell, and a second selector having inputs connected to said output of said first selector and said second boundary scan cell and an output connected to said output terminal, wherein said boundary scan circuit and said macro test circuit are unified.

2. A test circuit claimed in claim 1, further including a macro test input terminal provided on said circuit board for receiving a macro test control signal and connected to said first selector for causing said first selector to select said existing macro when said macro test control signal is activated, and a test access port provided on said circuit board for generating a boundary scan test control signal to said second selector so as to causing said second selector to select said output of said first selector when said boundary scan test control signal is deactivated.

3. A test circuit for testing a system logic constituted of an existing macro and a newly created circuit both mounted on a circuit board, comprising a boundary scan circuit for testing said newly created circuit and a macro test circuit for testing only said existing macro independently of said newly created circuit said boundary scan circuit including at least a first boundary scan cell and a second boundary scan cell, and said macro test circuit including an input terminal provided on said circuit board and connected to said first boundary scan cell, a first line for connecting said input terminal to said existing macro, an output terminal provided on said circuit board and connected to said second boundary scan cell, and a selector having inputs connected to said existing macro, said newly created circuit and said second boundary scan cell, respectively, and an output connected to said output terminal wherein said boundary scan circuit and said macro test circuit are unified.

4. A test circuit claimed in claim 3, further including a test access port for generating a macro test control signal and a boundary scan test control signal to said selector so as to cause said selector to select said existing macro when said macro test control signal is activated, and to cause said selector to select said newly created circuit when both of said macro test control signal and said boundary scan test control signal are deactivated.

5. A test method for testing a system logic constituted of an existing macro and a newly created circuit both mounted on a circuit board, wherein the test of said newly created circuit and the test of said existing macro are carried out independently of each other by changing the test from one to the other of said newly created circuit and said existing macro, wherein the test of said newly created circuit is carried out by using a boundary scan circuit, and the test of said existing macro is carried out by using a macro test circuit, said boundary scan circuit including at least a first boundary scan cell and a second boundary scan cell, and said macro test circuit including an input terminal provided on said circuit board and connected to said first boundary scan cell, a first line for connecting said input terminal to said existing macro, an output terminal provided on said circuit board and connected to said second boundary scan cell, a first selector having inputs connected to said existing macro and said newly created circuit, respectively, and an output connected to said second boundary scan cell, and a second selector having inputs connected to said output of said first selector and said second boundary scan cell and an output connected to said output terminal.

6. A test method claimed in claim 5 wherein said circuit board further includes a macro test input terminal for receiving a macro test control signal and connected to said first selector for causing said first selector to select said existing macro when said macro test control signal is activated, and a test access port for generating a boundary scan test control signal to said second selector so as to causing said second selector to select said output of said first selector when boundary scan test control signal is deactivated.

7. A test method claimed in claim 6 wherein said newly created circuit is tested in said boundary scan method by causing said first selector to select said newly created circuit by means of said macro test control signal and by causing said second selector to select said second boundary scan cell by means of said boundary scan test control signal, and wherein said existing macro is tested by causing said first selector to select said existing macro by means of said macro test control signal and by causing said second selector to select the output of said first selector by means of said boundary scan test control signal, so that a test data is inputted from said input terminal to said existing macro, and data outputted from said existing macro is outputted through said first and second selectors to said output terminal.

8. A test method for testing a system logic constituted of an existing macro and a newly created circuit both mounted on a circuit board, wherein the test of said newly created circuit and the test of said existing macro are carried out independently of each other by changing the test from one to the other of said newly created circuit and said existing macro, said boundary scan circuit including at least a first boundary scan cell and a second boundary scan cell, and said macro test circuit including an input terminal provided on said circuit board and connected to said first boundary scan cell, a first line for connecting said input terminal to said existing macro, an output terminal provided on said circuit board and connected to said second boundary scan cell, and a selector having inputs connected to said existing macro, said newly created circuit and said second boundary scan cell, respectively, and an output connected to said output terminal, wherein the test of said newly created circuit, is carried out by using a boundary scan circuit, and the test of said existing macro is carried out by using a macro test circuit.

9. A test method claimed in claim 8 wherein said circuit board further includes a test access port for generating a macro test control signal and a boundary scan test control signal to said selector so as to cause said selector to select said existing macro when said macro test control signal is activated, and to cause said selector to select said newly created circuit when both of said macro test control signal and said boundary scan test control signal are deactivated.

10. A test method claimed in claim 9 wherein said newly created circuit is tested in said boundary scan method by causing said selector to select said second boundary scan cell by means of said boundary scan test control signal, and wherein said existing macro is tested by causing said selector to select said existing macro by means of said macro test control signal, so that a test data is inputted from said input terminal to said existing macro, and data outputted from said existing macro is outputted through said selector to said output terminal.

* * * * *